(12) United States Patent
Myung et al.

(10) Patent No.: US 8,397,109 B2
(45) Date of Patent: Mar. 12, 2013

(54) BIT MAPPING/DEMAPPING METHOD AND APPARATUS FOR COMMUNICATION SYSTEM

(75) Inventors: Se Ho Myung, Suwon-si (KR); Jae Yoel Kim, Suwon-si (KR); Yeon Ju Lim, Seoul (KR); Sung-Ryul Yun, Suwon-si (KR); Hak Ju Lee, Incheon (KR)

(73) Assignee: Samsung Electronics Co., Ltd (KR)

( * ) Notice: Subject to any disclaimer, the term of this patent is extended or adjusted under 35 U.S.C. 154(b) by 561 days.

(21) Appl. No.: 12/641,888

(22) Filed: Dec. 18, 2009

(65) Prior Publication Data

US 2010/0162073 A1 Jun. 24, 2010

(30) Foreign Application Priority Data

Dec. 18, 2008 (KR) ........................ 10-2008-0128938

(51) Int. Cl.
*G06F 11/00* (2006.01)

(52) U.S. Cl. ...................................... 714/701

(58) Field of Classification Search .................. 714/701, 714/702, 752, 758, 761, 762, 800, 801
See application file for complete search history.

(56) References Cited

U.S. PATENT DOCUMENTS

| | | | | |
|---|---|---|---|---|
| 8,190,981 | B2* | 5/2012 | Jeong et al. | 714/801 |
| 2005/0152408 | A1* | 7/2005 | Jeong et al. | 370/529 |
| 2005/0216821 | A1* | 9/2005 | Harada | 714/801 |
| 2009/0063930 | A1* | 3/2009 | Matsumoto et al. | 714/752 |

* cited by examiner

*Primary Examiner* — Scott Baderman
*Assistant Examiner* — Joseph Kudirka
(74) *Attorney, Agent, or Firm* — The Farrell Law Firm, P.C.

(57) ABSTRACT

An improved bit mapping method and apparatus for a communication system is provided. A bit mapping method of the present invention includes arranging coded bits in a codeword in an order of recovery capability. A shift region including a number of coded bits is set. The coded bits are rearranged in the shift region by shifting the shift region by a number of bits equal to a number of bits that is indicated by a shift factor. The rearranged coded bits are mapped into a modulation symbol in an order of reliability from a lowest reliability bit position to a highest reliability bit position of the modulation symbol.

14 Claims, 11 Drawing Sheets

FIG. 1
(PRIOR ART)

$$H_1 = \begin{bmatrix} 1 & 1 & 1 & 1 & 1 & 1 & 0 & 0 \\ 1 & 1 & 0 & 1 & 0 & 1 & 1 & 0 \\ 1 & 1 & 1 & 0 & 0 & 0 & 1 & 1 \\ 1 & 0 & 1 & 1 & 1 & 0 & 0 & 1 \end{bmatrix}$$

EXAMPLE OF 256 QAM MAPPING

BIT MAPPING/DEMAPPING METHOD AND APPARATUS FOR COMMUNICATION SYSTEM

PRIORITY

This application claims priority to an application entitled "BIT MAPPING/DEMAPPING METHOD AND APPARATUS FOR COMMUNICATION SYSTEM" filed in the Korean Intellectual Property Office on Dec. 18, 2008 and assigned Serial No. 10-2008-0128938, the contents of which are hereby incorporated by reference.

BACKGROUND OF THE INVENTION

1. Field of the Invention

The present invention relates generally to a communication system and, in particular, to an improved bit mapping method and apparatus for a communication system.

2. Description of the Related Art

In a wireless communication system, the data generated at a source is transmitted after being subject to signal processing, which may include source coding, channel coding, interleaving, modulation, and further suitable steps. The signal received at a destination is subject to signal processing, which may include demodulation, deinterleaving, channel decoding, and source decoding, and further suitable steps.

Typically, the signal transmitted over the air is likely to be distorted by noise and fading effects of the channel and Inter-Symbol Interference (ISI).

Particularly in the high speed digital communication systems (such as next generation mobile communication systems, digital broadcast systems, broadband Internet access systems), overcoming these noise, fading, and ISI problems is one of the significant issues to fulfill the high data rate and reliability requirements. Channel coding and interleaving are well-known techniques to provide protection from error.

Interleaving is a technique to arrange data in a non-contiguous manner to avoid burst errors while passing through fading channels, thereby protecting the data from errors. Interleaving also increases the coding efficiency.

Channel coding is a technique to overcome transmission errors over a noisy and fading channel such to a destination node to improve the communication reliability. Due to their error correction functionality, the codes using in channel coding are referred to as Error Correction Codes (ECC). In order to improve the error correction capability, various types of error correction codes are proposed and under development.

Well-known error correction codes include a block code, a convolutional code, a turbo code, a Low Density Parity Check (LDPC) code, and so forth. The embodiments of the present invention to be described hereinafter make use of the LDPC code. Accordingly, a brief description is now given of prior art LDPC codes.

Although not guaranteed, the LDPC code is known to be able to minimize the transmitted signal loss. The LDPC code invented in the early 1960's is a forward error correction code that exhibits properties close to the Shannon limit.

Soon after the invention of the LDPC codes, they were forgotten due to their implementation complexity that surpassed the technology at that time. As the use LDPC code has been rediscovered since 1996 with the advance of information and communication technologies, extensive research has been conducted to determine the characteristics and methods for creating LDPC codes available with iterative decoding without compromising complexity. Recently, the LDPC code has become as an excellent error correction code appropriate for the next generation wireless communication systems along with the turbo code.

The LDPC code is usually represented by a bipartite graph, and its characteristics can be analyzed using the methods based on the graph theory, algebra, and probability theory. Typically, a graph model of a channel code is useful for describing a code. When information on an encoded bit corresponds to a vertex in a graph and the relation between encoded bits corresponds to an edge (i.e. a line segment), the graph model of the channel code may be considered as a communication network in which vertexes exchange predetermined messages through edges, thereby deriving a natural decoding algorithm. For instance, a decoding algorithm derived from a trellis, which may be considered a type of graph, includes a well-know Viterbi algorithm and a Bahl, Cocke, Jelinek, and Raviv (BCJR) algorithm.

Typically, the LDPC code is defined by a parity-check matrix and can be represented by a bipartite graph commonly referred to as a Tanner graph. In the bipartite graph, vertexes are divided into two different types. The LDPC code is represented by the bipartite graph formed by vertexes referred to as "variable node" and "check node." A variable node corresponds to an encoded bit.

FIG. 1 is a diagram illustrating a parity check matrix of an LDPC code having the codeword length of 8, and FIG. 2 is a diagram illustrating a Tanner graph corresponding to the parity check matrix of FIG. 1.

The description of an LDPC code represented by a graph is described with reference to FIGS. 1 and 2.

Referring to FIG. 1, 8 rows of the parity check matrix means that the LDPC code generates a codeword having the length of 8, and each column corresponds to the encoded 8 bits.

Referring to FIG. 2, the Tanner graph representing the LDPC code has 8 variable nodes $x_1$ 202, $x_2$ 204, $x_3$ 206, $x_4$ 208, $x_5$ 210, $x_6$ 212, $x_7$ 214, and $x_8$ 216, and 4 check nodes 218, 220, 222, and 224. The $i^{th}$ column and $i^{th}$ row of the parity check matrix $H_1$ of the LDPC code correspond to the variable node $x_i$ and the $j^{th}$ check node, respectively. If the element position at the place where the $i^{th}$ column and the $j^{th}$ row of the parity check matrix H1 of the LDPC code is 1, i.e. non-zero, this means that there exists an edge between the variable node $x_i$ and the $j^{th}$ check node in the Tanner graph as shown in FIG. 2.

The degree of each variable node or check node in the Tanner graph of the LDPC code means the number of edges of the node, and the number of edges of the node is equal to the number of non-zero elements on the column or row to which the corresponding element belongs in the parity-check matrix H1 of the LDPC code. Accordingly, in FIG. 2, the degrees of the variable nodes 202, $x_2$ 204, $x_3$ 206, $x_4$ 208, $x_5$ 210, $x_6$ 212, $x_7$ 214, and $x_8$ 216 are 4, 3, 3, 3, 2, 2, 2, and 2, respectively, and the degrees of the check nodes 218, 220, 222, and 224 are 6, 5, 5, and 5. Also, the numbers of nonzero elements of the columns or rows to which the respective elements corresponding to the variable nodes are identically 4, 3, 3, 3, 2, 2, 2, and 2; and the numbers of nonzero elements of the column or row to which the elements corresponding to the check nodes are identically 6, 5, 5, and 5.

As described above, each coded bit is mapped to a corresponding column of the parity check matrix and a corresponding variable node of the Tanner graph. The degree of each variable node corresponding to the coded bit is also referred to as a degree of coded bit.

The LDPC code is characterized in that a code word bit having a high degree is superior to a code word bit having a low degree in decoding performance. This means that the high degree variable node can acquire much information through more iterative decoding steps as compared to the low degree variable node, resulting in superior decoding performance.

A description of the signal constellation of Quadrature Amplitude Modulation (QAM), as a high degree modulation scheme typically used in wireless communication, is described hereinafter. In the QAM, the modulated symbol is composed of a real part and an imaginary part and is defined by the sizes of the real and imaginary parts with different signs. Prior to explaining the characteristics of the QAM, a Quadrature Phase Shift Keying (QPSK) modulation scheme will be described.

FIG. 3A is a diagram illustrating a Quadrature Phase Shift Keying (QPSK) signal constellation.

In FIG. 3A, a QPSK symbol represents two bits of input data. The $y_0$ determines the sign of the real part, and $y_1$ determines the sign of the imaginary part. That is, if the $y_0$ is 0, the real part has the plus sign (+) and, otherwise, if the $y_0$ is 1, the real part has the minus sign (−). Also, if $y_1$ is 0, the imaginary part has the plus sign (+) and, otherwise, if the $y_1$ is 1, the imaginary part has the minus sign (−). Since the $y_0$ and $y_1$ are the sign bits, the error probabilities of the $y_0$ and $y_1$ are identical with each other. In the $y_{0,q}$ and $y_{1,q}$, q is an index indicating the $q^{th}$ symbol.

FIG. 3B is a diagram illustrating a 16-QAM signal constellation.

In FIG. 3B, a 16-QAM symbol represents 4 bits of input data ($y_0$, $y_1$, $y_2$, and $y_3$). The $y_0$ and $y_2$ bits determine the sign and size of the real part respectively, and the $y_1$ and $y_3$ bits determine the sign and size of the imaginary part. That is, the $y_0$ and $y_1$ bits determine the signs of the real and imaginary parts, and the $y_2$ and $y_3$ bits determine the sizes of the real and imaginary parts. Since it is easier to determine the sign of a signal than to determine the size of the signal, the error probabilities of the $y_2$ and $y_3$ are higher than those of the $y_0$ and $y_1$. Accordingly, the non-error probability or reliability of the bits can be expressed as $R(y_0)=R(y_1)>R(y_2)=R(y_3)$. Here, R(y) denotes the reliability of y bit. Unlike the QPSK, the bits ($y_0$, $y_1$, $y_2$, and $y_3$) constituting the QAM symbol have different reliabilities.

In 16-QAM, two bits among the 4 bits constituting the modulated symbol represent the signs of the real and imaginary parts of the modulated symbol, and the remaining two bits represent the sizes of the real and imaginary parts of the symbol. The order and roles of the bits ($y_0$, $y_1$, $y_2$, and $y_3$) constituting the symbol can be changed depending on the system implementation.

FIG. 3C is a diagram illustrating a 64-QAM signal constellation.

In FIG. 3C, a 64-QAM symbol represents 6 bits of input data ($y_0$, $y_1$, $y_2$, $y_3$, $y_4$, and $y_5$). The $y_0$, $y_2$, and $y_4$ bits determine the sign and size of the real part of the symbol, and the $y_1$, $y_3$, and $y_5$ bits determine the sign and size of the imaginary part of the symbol. Since it is easier to determine the sign of the modulated symbol than to determine the size of the modulated symbol, the reliabilities of the $y_0$ and $y_1$ bits are higher than those of the $y_2$, $y_3$, $y_4$, and $y_5$. The $y_2$ and $y_3$ are determined according to whether the size of the modulated symbol is greater than 4 or not. The $y_4$ and $y_5$ are determined according to whether the size of the modulated symbol is close to 4 or 0 from the point of reference of 2 or whether the size of the modulated symbol is close to 4 or 8 from the point of reference of 6. Accordingly, the determination range of $y_2$ and $y_3$ is 4, and the determination range of $y_4$ and $y_5$ is 2. This means that the reliabilities of the $y_2$ and $y_3$ are greater than those of the $y_4$ and $y_5$. In short, the reliabilities of the bits constituting a modulated symbol have the relationship of $R(y_0)=R(y_1)>R(y_2)=R(y_3) R(y_4)=R(y_5)$.

In the 64-QAM scheme, 2 bits among the 6 bits constituting the modulated symbol determine the signs of the real and imaginary parts of the modulated symbol, and the remaining 4 bits represent the sizes of the real and imaginary parts of the modulated symbol. The order and roles of the bits ($y_0$, $y_1$, $y_2$, $y_3$, $y_4$, and $y_5$) can be changed depending on the system implementation. In the high order QAM constellations including 256-QAM, the bits constituting a modulated symbol are arranged with their roles and reliabilities in similar manner. That is, the modulated symbol consists of $y_0$, $y_1$, $y_2$, $y_3$, $y_4$, $y_5$, $y_6$, and $y_7$, the reliabilities of the bits constituting the modulated symbol have the relationship of $R(y_0)=R(y_1)>R(y_2)=R(y_3)>R(y_4)=R(y_5)>R(y_6)=R(y_7)$.

In the conventional communication systems based on LDPC codes, however, interleaving and deinterleaving is performed without taking into consideration the characteristics of the reliabilities of the bits constituting the LDPC code or high order modulated codes, or only taking into consideration the order of variable nodes or check nodes, thereby failing to minimize the distortion of the transmission signal.

Furthermore, the conventional LDPC code-based communication systems are implemented in a group of two consecutive bits, $y_{2i}$ and $y_{2i+1}$, only with the reason that these two bits are identical to each other in reliability, thereby failing to maximize the benefit of LDPC codes.

SUMMARY OF THE INVENTION

In order to solve at least the above mentioned problems, the present invention provides a symbol mapping method and apparatus for a communication system using LDPC codes that is capable of improving the coding gain of the LDPC codes.

Also, the present invention provides a symbol demapping method and apparatus for a communication system using LDPC codes that is capable of improving system throughput.

In accordance with an embodiment of the present invention, a bit mapping method for a communication system includes arranging coded bits in a codeword in order of recovery capability; setting a shift region including a number of coded bits; rearranging the coded bits in the shift region by shifting the shift region as much as a number of bits that is indicated by a shift factor; and mapping the rearranged coded bits into a modulation symbol in order of reliability from the lowest reliability bit position to the highest reliability bit position of the modulation symbol.

In accordance with another embodiment of the present invention, a bit demapping method for a communication system includes extracting a shift factor from a signal demodulated from a received signal; demapping the demodulated signal to obtain a codeword of coded bits; and rearranging the coded bits in the codeword by shifting a shift region as much as a number of bits indicated by the shift factor.

In accordance with another embodiment of the present invention, a bit mapping apparatus for a communication system includes a controller which arranges coded bits in a codeword in order of recovery capability, sets a shift region including a number of coded bits, and generates a shift factor; a bit shifter which rearranges the coded bits by shifting the shift region as much as a number of bits that is indicated by the shift factor and inserting the rest coded bits into bit positions unoccupied by the shift region in the codeword while maintaining sequential order; and a bit mapper which maps the rearranged coded bits into a modulation symbol in order of reliability from the lowest reliability bit position to the highest reliability bit position of the modulation symbol.

In accordance with still another embodiment of the present invention, a bit demapping apparatus for a communication system includes a demodulator which demodulates a received signal and outputs the demodulated signal; a controller which extracts a shift factor from the demodulated signal and determines a shift scheme based on the shift factor; a bit demapper which demaps the demodulated signal to obtain a codeword of coded bits; and a bit shifter which rearranges the coded bits in the codeword by shifting a shift region as much as a number of bits indicated by the shift factor and inserting the rest coded bits into bit positions unoccupied by the shift region in the codeword while maintaining sequential order.

BRIEF DESCRIPTION OF THE DRAWINGS

The above and other objects, features and advantages of the present invention will be more apparent from the following detailed description in conjunction with the accompanying drawings, in which:

FIG. 1 is a diagram illustrating a parity check matrix of an LDPC code having the codeword length of 8;

DETAILED DESCRIPTION OF EMBODIMENTS OF THE INVENTION

Embodiments of the present invention are described in detail with reference to the accompanying drawings. The same reference numbers are used throughout the drawings to refer to the same or like parts. Detailed descriptions of well-known functions and structures incorporated herein may be omitted to avoid obscuring the subject matter of the present invention.

The terms and words used in the following description and claims are not limited to the bibliographical meanings, but are merely used to enable a clear and consistent understanding of the invention. Accordingly, it should be apparent to those skilled in the art that the following description of embodiments of the present invention are provided for illustration purpose only and not for the purpose of limiting the invention as defined by the appended claims and their equivalents.

Figure 2:
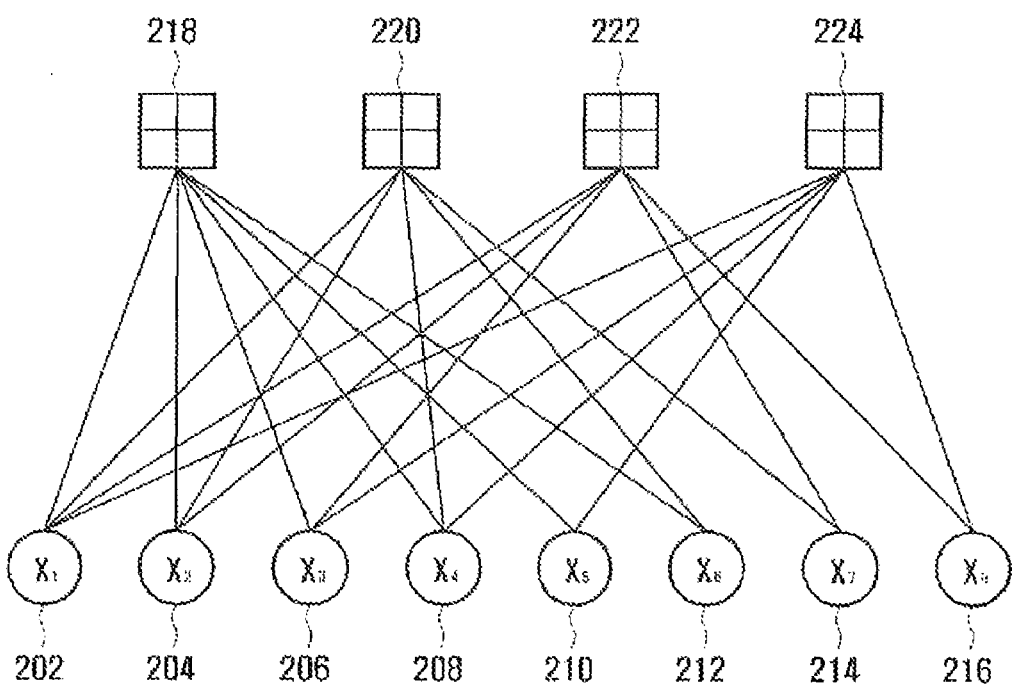
FIG. 2 is a diagram illustrating a Tanner graph corresponding to the parity check matrix of FIG. 1.
Figure 3A:
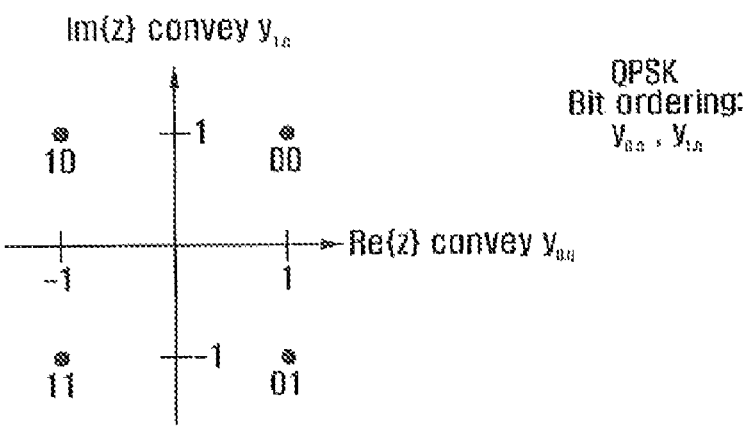
FIG. 3A is a diagram illustrating a Quadrature Phase Shift Keying (QPSK) signal constellation.
Figure 3B:
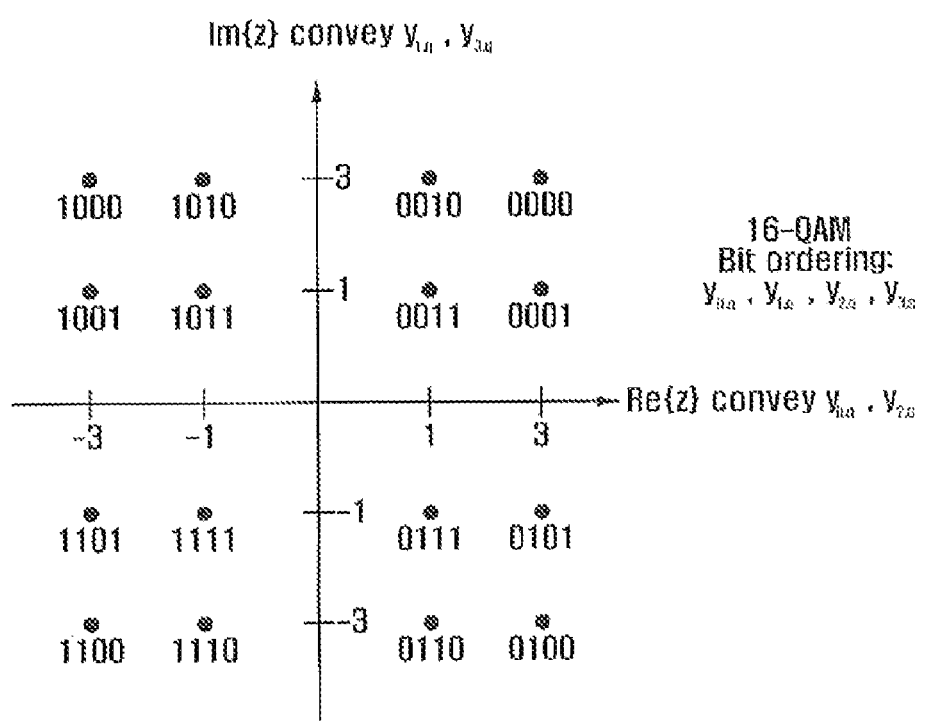
FIG. 3B is a diagram illustrating a 16-Quadrature Amplitude Modulation (QAM) signal constellation.
Figure 3C:
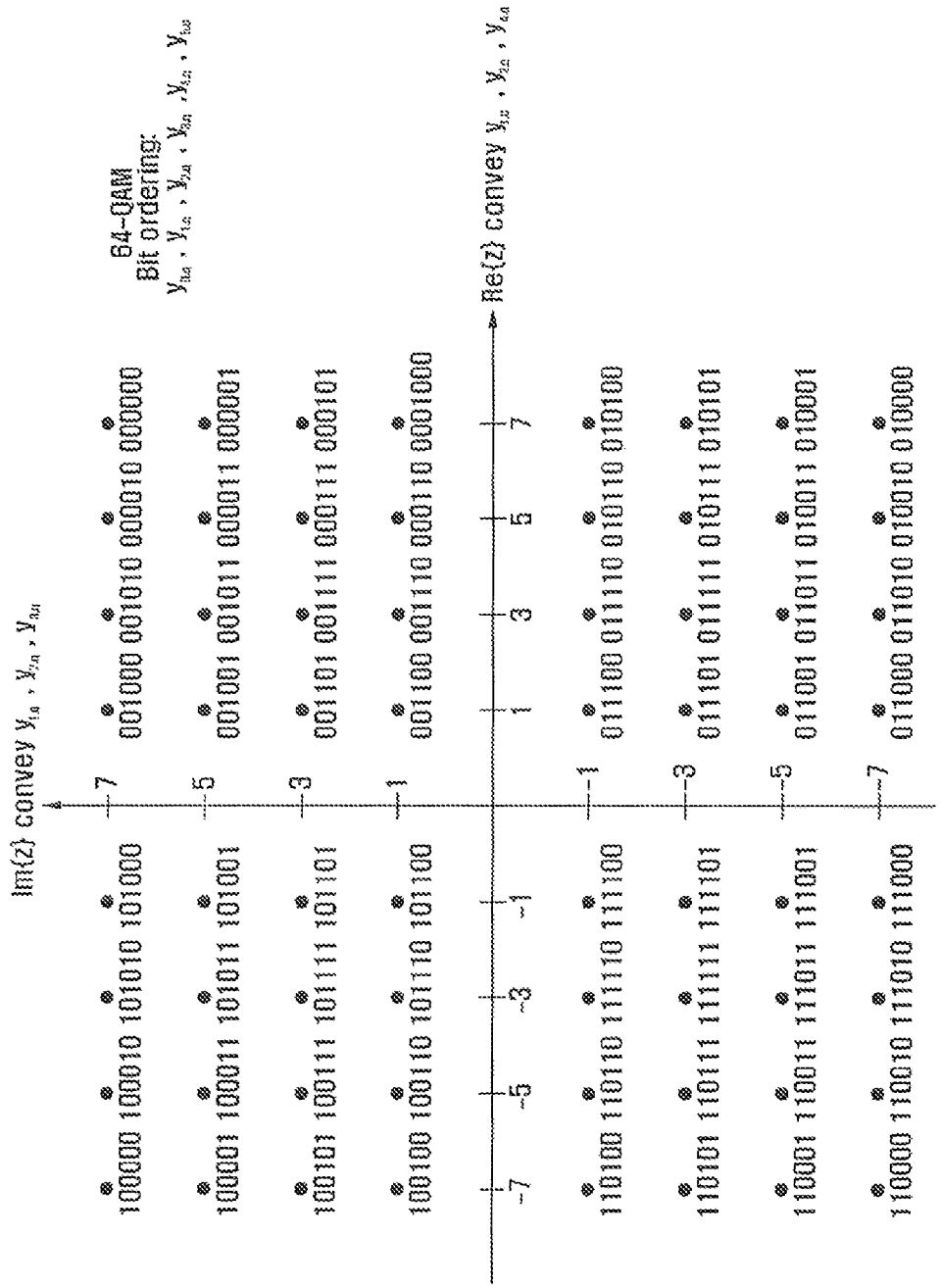
FIG. 3C is a diagram illustrating a 64-QAM signal constellation.
Figure 4:
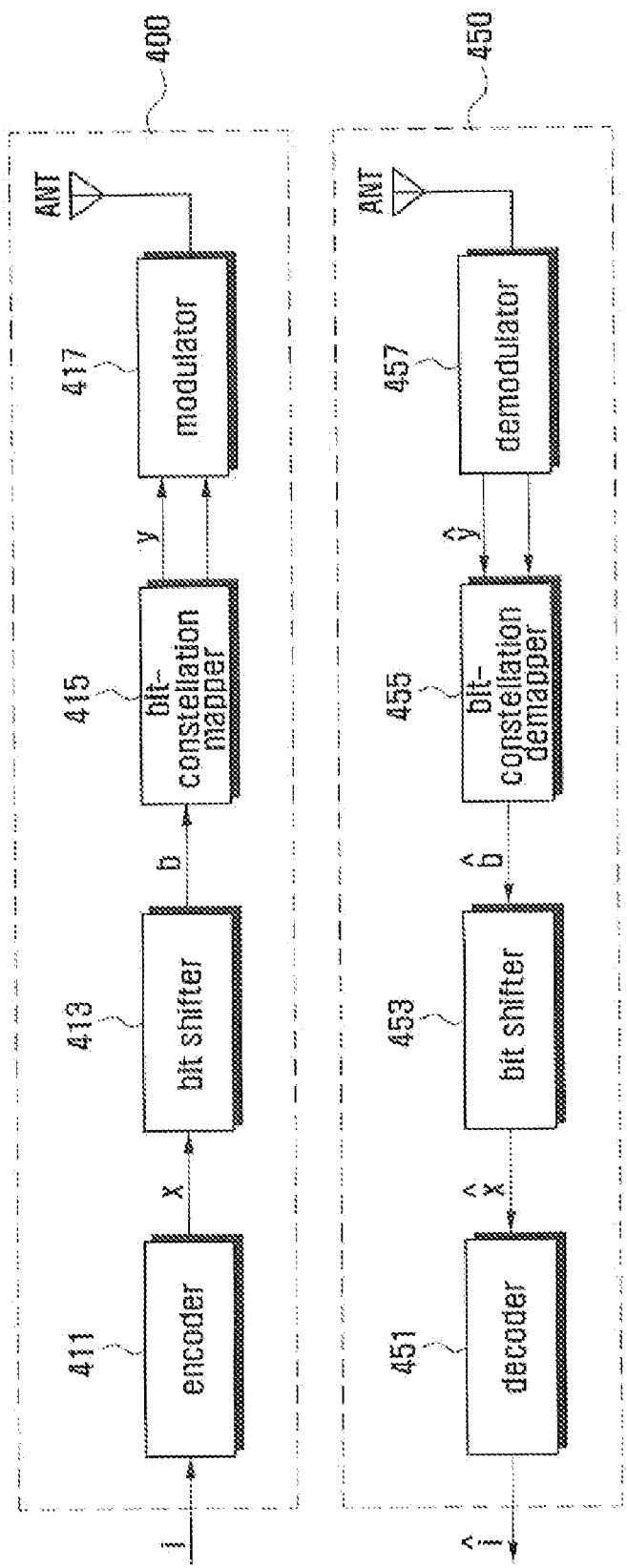
FIG. 4 is a block diagram illustrating configurations of a transmitter and a receiver of a communication system using LDPC code according to an embodiment of the present invention.

FIG. 4 is a block diagram illustrating configurations of a transmitter and a receiver of a communication system using LDPC code according to an embodiment of the present invention.

As shown in FIG. 4, the transmitter 400 includes an encoder 411, a bit shifter 413, a bit-constellation mapper 415, and a modulator 417. The bit-constellation mapper 415 maps the bits output by the bit shifter 413 into a constellation point. The receiver 450 includes a demodulator 457, a bit-constellation demapper 455, a bit shifter 453, and a decoder 451.

The operations of the transmitter 400 and the receiver 450 of FIG. 4 will be described first, and then the principle of the bit-constellation mapping process according to an embodiment of the present invention will be described with reference to FIG. 5.

If an information data bit stream (i) is input, the encoder 411 encodes the information data bit stream with an LDPC code and outputs a stream of coded bits (x) to the bit shifter 413.

The bit shifter 413 performs bit-shifting on the coded bits (x) according to a method proposed in an embodiment of the present invention and then outputs the coded bits (b) to the bit-constellation mapper 415. In the bit shifting process, the bit shifter 413 sorts the coded bits in order of degree, classifies the coded bits of low degrees into a shift region, shifts the shift region by a number of bits equal to a number of bits indicated by the shift factor. In an embodiment of the present invention, it is preferred to classify the first and second degree coded bits into the shift region. However, the present invention is not limited thereto.

The bit-constellation mapper 415 maps the coded bits (b) (i.e. the bit-shifted coded bits) output by the bit shifter 413 into corresponding constellation points and outputs the constellation symbols (y) to the modulator 417. In the bit-constellation mapping process, the shifted coded bits (b) are assigned the bit positions of a modulation symbol in descending order of reliability.

The modulator 417 modulates the signals output by the bit-constellation mapper 415 in a predetermined modulation scheme and then transmits the modulated signal through a transmit antenna (ANT). The bit shifting and mapping processes are performed to minimize the Bit Error Rate (BER) or the Frame Error Rate (FER), resulting in performance improvement.

Demodulator 457 performs demodulation on the received signal and outputs the demodulated signal to the bit-constellation demapper 455. The bit-constellation demapper 455 demaps the demodulated signal and outputs the LDPC codeword bits to the bit shifter 453. The bit shifter 453 recovers the original arrangement of the bits of the codeword and outputs the codeword bits to the decoder 451. The decoder 451 performs decoding on the signal output by the bit shifter 453 to output original data.

Figure 5A:
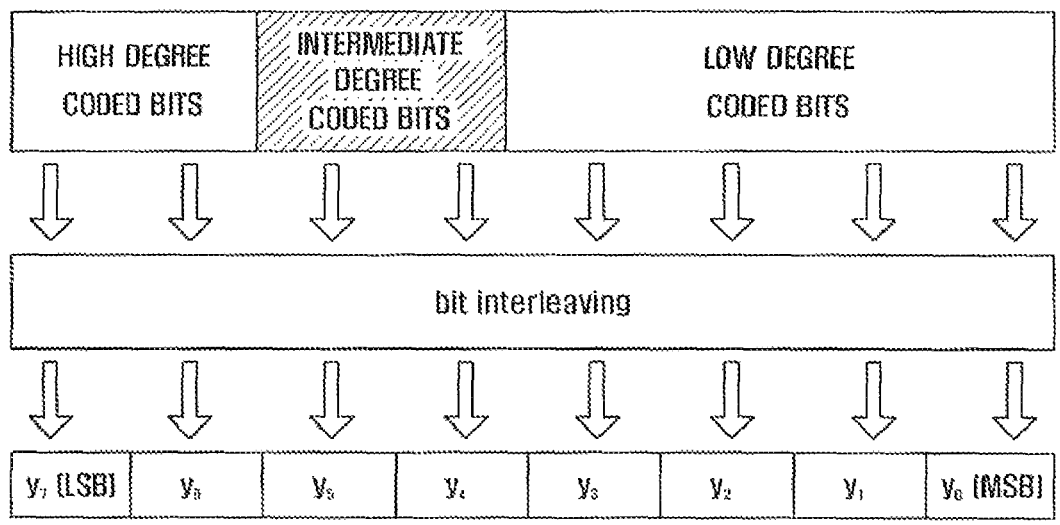
FIG. 5A is a diagram illustrating a conventional bit-constellation mapping method.
Figure 5B:
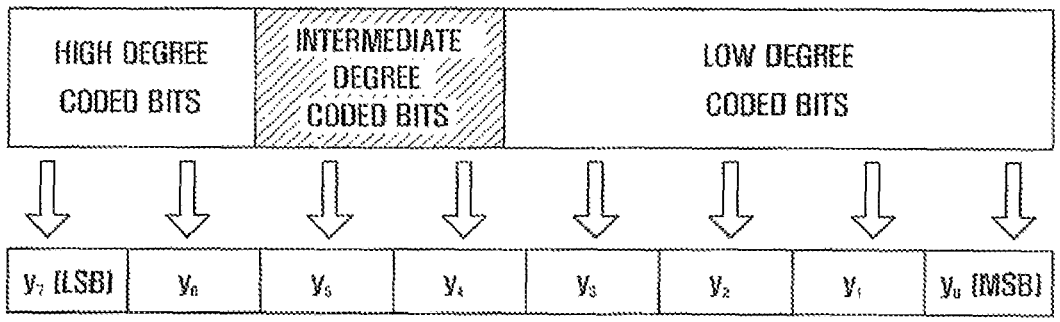
FIG. 5B is a diagram illustrating another conventional bit-constellation mapping method.

FIG. 5A is a diagram illustrating a conventional bit-constellation mapping method, and FIG. 5B is a diagram illustrating another conventional bit-constellation mapping method.

FIG. 5A illustrates a bit mapping process for simplifying the explanation of the interleaving and mapping processes to minimize the BER and FER. In FIG. 5A, it is assumed that the Tanner graph corresponding to the LDPC code has three degrees.

Referring to FIGS. 5A and 5B, the bit mapping is performed in a predetermined mapping pattern, and the arrangement of the coded bits in the modulation symbol is determined depending on the mapping pattern for use in the bit shifter. The interleaving step can be omitted or performed in a fixed pattern. In this case, the bit mapping pattern is determined regardless of the modulation scheme.

In terms of the performance optimization of the LDPC code, if the bit mapping pattern is fixed, the degree distribution of the LDPC coded symbols for the optimum performance varies depending on the modulation scheme. This means that different parity check matrices have to be used to optimize the LDPC code performance according to the modulation scheme.

In an embodiment of the present invention, the bit mapping pattern is adjusted depending on the modulation scheme so as to optimize the LDPC code performance without changing the parity check matrix, thereby overcoming the inefficiency of the conventional LDPC code-based communication system requiring large storage capacity and processing complexity caused by use of different parity check matrices according to the modulation scheme.

Prior to explaining the bit mapping method, the characteristics of the bits constituting an LDPC codeword will be described. In the LDPC codeword, the high degree bits are superior to the low degree bits in a performance enhancement effect through iterative decoding. In more detail, even when an entire LDPC codeword received through the channel is distorted by noise, the errors occurring in high order bits can be corrected, on average, more quickly and accurately than those occurring in low order bits through the iterative decoding process. This means that the high order bits are superior to the low order bits in recovery capability. The recovery capability is a probability to accurately correct an erroneous bit. The higher the recovery probability, the higher the recovery capability.

Accordingly, even when the high order bits of LDPC codeword are mapped to the low reliability bit positions of the modulation symbol, the high order bits can be recovered into the original signal with a high probability in the decoding process. For this reason, and generally speaking, the low degree bits (having low recovery probability) are assigned the high reliability bit positions of the modulation symbol and the high degree bits (having high recovery probability) are assigned the low reliability bit positions of the modulation symbol.

Although the following description is directed to the LDPC code, the present invention is applicable to other types of codes that can be processed in order of recovery capability of the coded bits. The high degree bits of an LDPC codeword have high recovery capabilities, and the low degree bits of the LDPC codeword have low recovery capabilities.

However, when the ratio of the high degree bits to the low degree bits is high, the influence among the high degree bits increases in the decoding process. In this case, the large number of high degree bits is mapped to the low reliability bit positions of the modulation symbol such that the influences of the low reliability bits increase, resulting in a counter effect.

In order to avoid this counter effect, it is preferred to partially shift the high order bits to the low reliability bit positions of the modulation symbol rather than entirely depending on the modulation scheme.

Mapping the lowest degree bit of an LDPC codeword to the highest reliability bit of a modulation symbol according to the degree distribution of the LDPC code and the modulation scheme may degrade the performance. Since the LDPC coded bit-modulation symbol mapping shows different characteristics depending on the degree distribution (i.e. recovery capability distribution) and the modulation scheme, it is difficult to guarantee the optimized performance in all cases with a fixed mapping pattern. In an embodiment of the present invention, a bit shifting and mapping method is proposed to efficiently map the coded bits into the modulation symbol in adaptation to the degree distribution of the LDPC code and modulation scheme.

Figure 6:
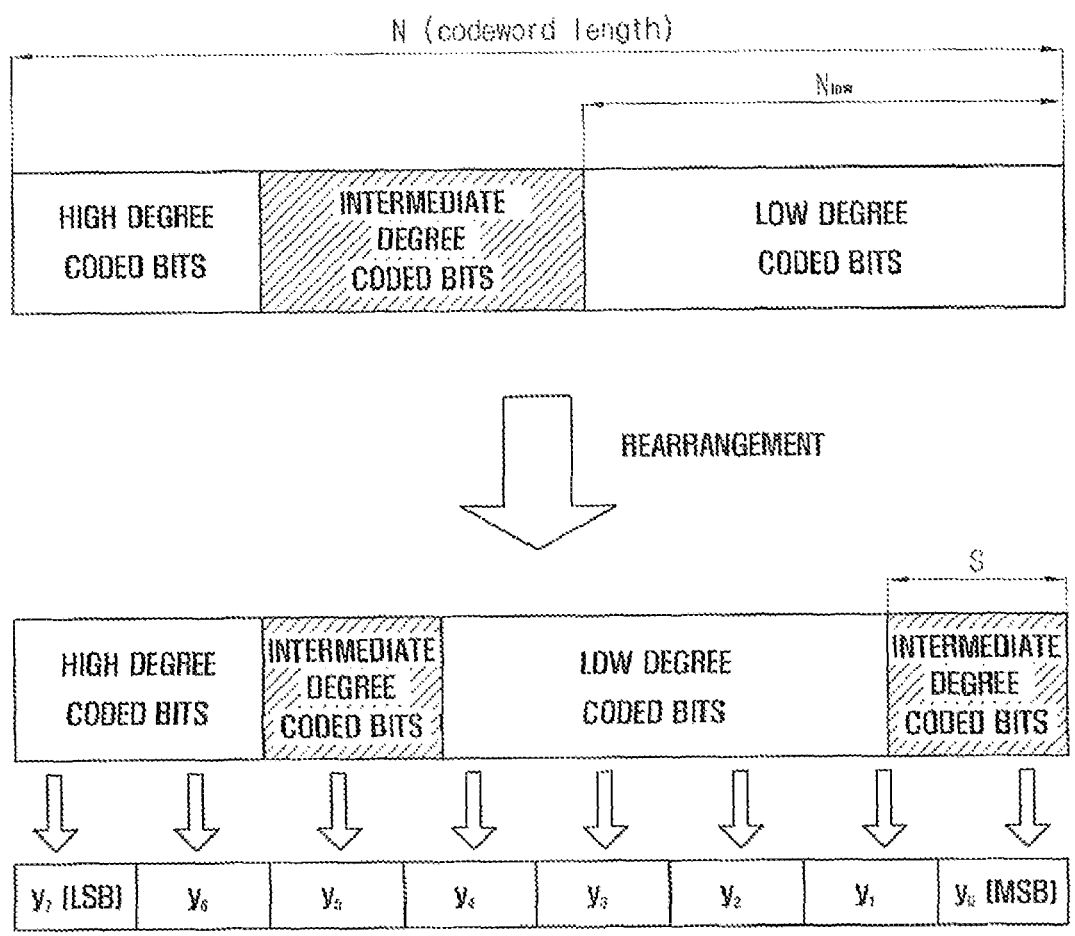
FIG. 6 is a diagram illustrating a principle of a bit mapping method for a communication system using an LDPC code according to an embodiment of the present invention.

FIG. 6 is a diagram illustrating a principle of a bit mapping method for a communication system using an LDPC code according to an embodiment of the present invention. In the embodiment of FIG. 6, description is made with the LDPC code of which the codeword length is N and a number of low degree bits of the codeword is $N_{low}$. Preferably, the low degree bits consist of the first and second degrees in an embodiment, but is not limited thereto.

Referring to FIG. 6, the coded bits of an LDPC codeword that are arranged in order of degree (i.e. recovery capability) are rearranged differently according to a shift factor (S). The shift factor (S) is a value in the range from 0 to $N-N_{low}-1$. In a rearrangement rule according to an embodiment of the present invention, a region of the low degree bits is shifted left by a number of bits equal to the number of bits that is indicated by the shift factor (S).

That is, the shift region is set first and then the shift region is shifted by a number of bits equal to the number of bits that is indicated by the shift factor (S). In the embodiment of FIG. 6, a block of low degree bits is set as the shift region. A block of high degree bits or a preset block having a predetermined length can be set as the shift region in another embodiment of the present invention. The bits of the shift region are shifted by a number of bits equal to the number of bits that is indicated by S within the codeword, and the remaining coded bits are inserted into bit positions unoccupied by the shift region while maintaining their sequential order. This means that the low degree bit block is inserted into an intermediate bit block so as to be inserted between the intermediate degree bits.

The rearranged bits of the LDPC codeword are mapped to the bit position of a modulation symbol as shown in FIG. 6. If S is set to 0, the bit mapping pattern is identical to that of the conventional bit mapping method. In this case, the bits of the codeword are mapped to modulation symbol in ascending order from the Most Significant Bit (MSB) to the Least Significant Bit (LSB) of the modulation symbol. That is, the lowest degree bit of the codeword is mapped to the MSB position of the modulation symbol and the highest degree bit of the codeword is mapped to the LSB position of the modulation symbol.

If S is set to a nonzero value, the arrangement of the bits within the codeword is changed. In this case, as the shift factor (S) increases, the number of low degree bits to be assigned the high reliability bit positions of the modulation symbol decreases, while S intermediate degree bits are assigned the high reliability bit positions of the modulation symbol. If S is equal to $N-N_{low}-1$, the low degree bits are mapped to the low reliability bit positions of the modulation symbol.

Since the bits constituting the LDPC codeword are not fixed to their original positions but can be rearranged within the codeword by adjusting the shift factor (S), it is possible to use various bit mapping patterns selectively according to the modulation scheme.

Figure 7:
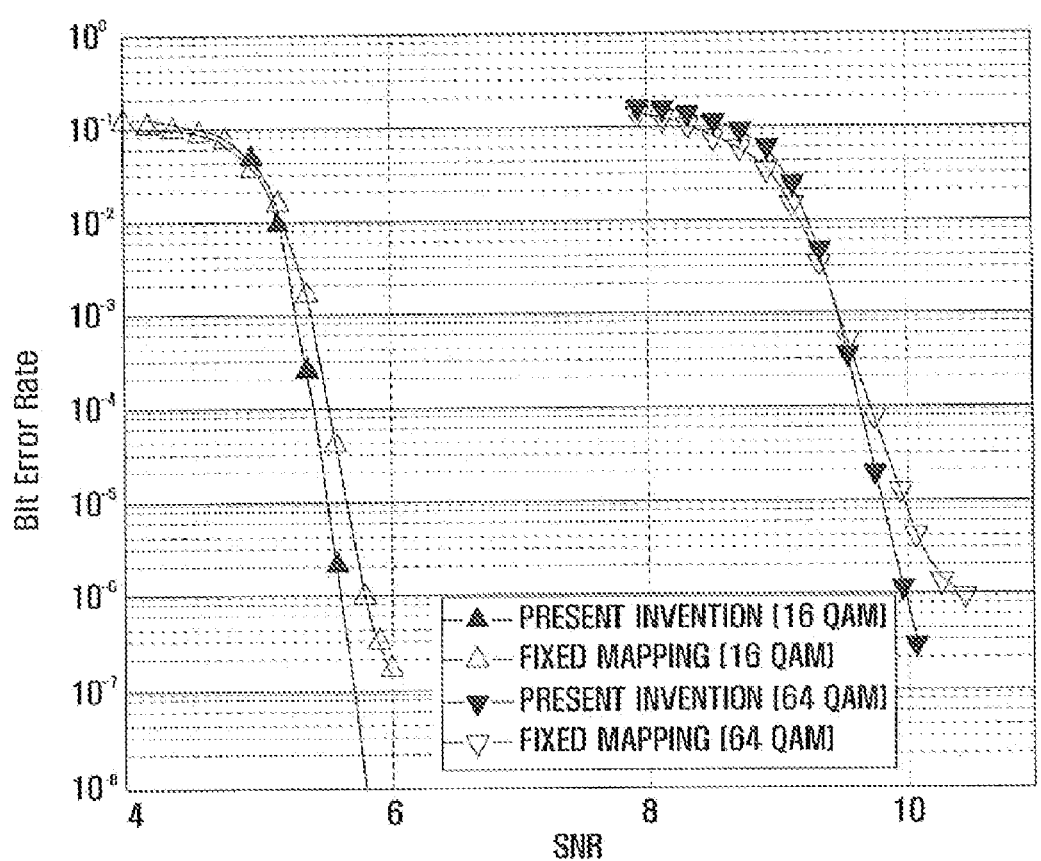
FIG. 7 is a graph illustrating simulation results of a communication system with the fixed bit mapping method and an adaptive bit mapping method according to an embodiment of the present invention.

FIG. 7 is a graph illustrating simulation results of a communication system with the fixed bit mapping method and an adaptive bit mapping method according to an embodiment of the present invention.

The simulations have been carried out to evaluate the Bit Error Rate (BER) in the system using a LDPC code having the coding rate of 4/5 and a codeword length of 16,200 for 16QAM and 64QAM. The fixed bit mapping method means that the shift factor S is set to 0.

The simulation results of FIG. 7 shows that the adaptive bit mapping method of the present invention is superior to the fixed bit mapping method in performance. In the case of using the fixed bit mapping method, even the error floor is shown in the range of a high Signal to Noise Ratio (SNR).

Figure 8:
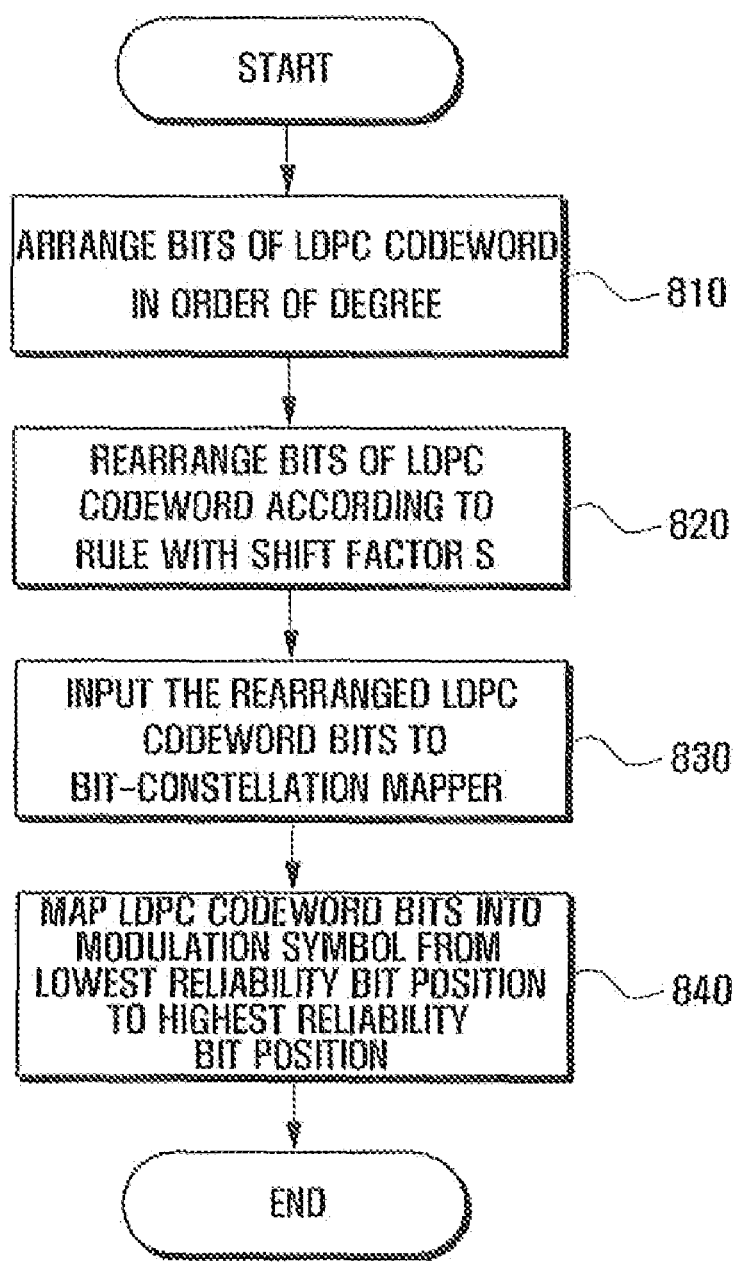
FIG. 8 is a flowchart illustrating a bit mapping method for a communication system using an LDPC code according to an exemplary embodiment of the present invention.

FIG. 8 is a flowchart illustrating a bit mapping method for a communication system using an LDPC code according to an embodiment of the present invention.

Referring to FIG. 8, once an LDPC codeword is input, the transmitter first arranges the bits constituting the LDPC codeword in order of degree in step 810. At this time, the arranged bits are represented by $C_0, C_1, \ldots, C_{N-1}$. Also, the transmitter determines a shift factor (S) in consideration of the degree distribution of the LDPC code and the modulation scheme. The shift factor (S) can be obtained from the results of a plurality of simulations or by using a density evolution analysis.

Next, the transmitter rearranges the bits of the LDPC codeword using the shift factor (S) in step 820 as shown in Equations (1), (2), and (3):

$$(C'_0, C'_1, \ldots, C'_{N-Nlow-S-1}) = (C_0, C_1, \ldots, C_{N-Nlow-S-1}) \quad (1)$$

$$(C'_{N-Nlow-S}, C'_{N=Nlow-S+1}, \ldots, C'_{N-S-1}) = (C_{N-S-1}, C_{N-Nlow+1}, \ldots, C_{N-1}) \quad (2)$$

$$(C'_{N-S}, C'_{N-S+1}, \ldots, C'_{N-1}) = (C_{N-Nlow-S}, C_{N-Nlow-S+1}, \ldots, C_{N-Nlow}) \quad (3)$$

where $(C'_0, C'_1, C'_{N-1})$ denotes the rearranged LDPC codeword bits, and $(C_0, C_1, \ldots, C'_{N-1})$ denotes the LDPC codeword bits before being rearranged.

The rearrangement represented by Equations (1), (2), and (3) is a case in which a shifting block of predetermined bits is shifted as much as S (Equation (2)) and a corresponding number of bits of the remaining bits are shifted in the reverse direction while maintaining their arrangement order (Equations (1) and (3)). That is, the bits belonging to the shift block are shifted by a number of bits equal to S and The corresponding number of bits among the remaining bits move in reverse direction for an amount equal to the amount the shift block is moved. Next, the transmitter inputs the rearranged LDPC codeword bits (C'0, C'1, C'N−1) to the bit-constellation mapper in step 830. As a consequence, the bit-constellation mapper maps the rearranged LDPC codeword bits into bit positions of a modulation symbol in order from the lowest reliability bit position to the highest reliability bit position in step 840.

Figure 9:
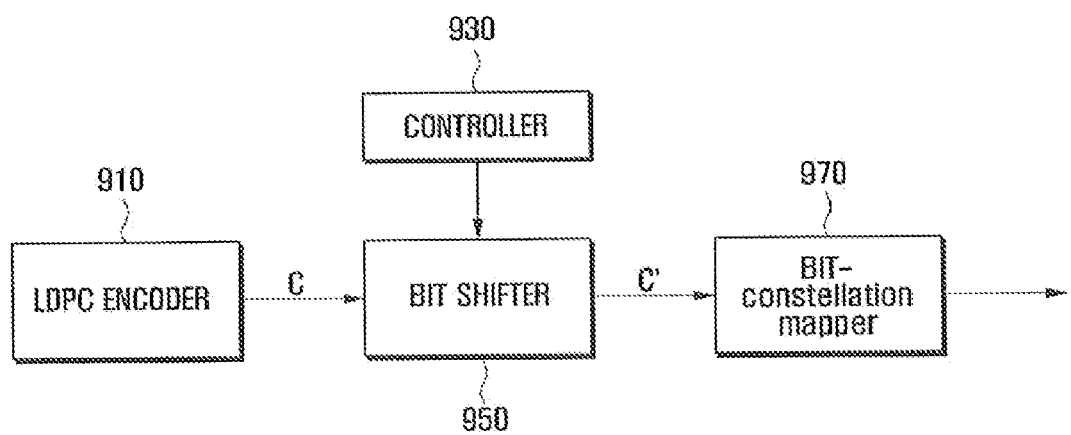
FIG. 9 is a block diagram illustrating a configuration of a transmitter for supporting a bit mapping method according to an embodiment of the present invention.

FIG. 9 is a block diagram illustrating a configuration of a transmitter for supporting a bit mapping method according to an embodiment of the present invention. As shown in FIG. 9, the transmitter includes an LDPC encoder 910, a controller 930, a bit shifter 950, and a bit-constellation mapper 970.

In FIG. 9, the controller 930 provides the bit shifter 950 and the bit-constellation mapper 970 with the information on the S value determined according to the requirements of the system. The bit shifter 950 sets a shift region of low degree bits within the LDPC codeword and rearranges the LDPC codeword bits shifting the shift region by a number of bits indicated by the shift factor.

That is, the bit shifter 950 shifts shifting the shift region by a number of bits that is indicated by the shift factor and inserts the remaining coded bits into bit positions unoccupied by the shift region in the codeword while maintaining sequential order. The LDPC codeword of which bits are rearranged is output to the bit-constellation mapper 970. The bit-constellation mapper 970 maps the rearranged bits into the modulation symbol from the lowest reliability bit position to the highest reliability bit position and transmits the modulation symbol.

Figure 10:
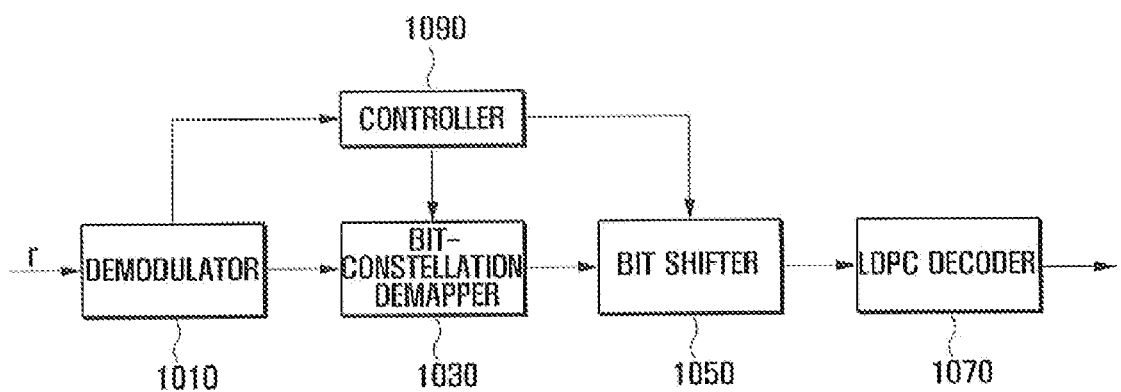
FIG. 10 is a block diagram illustrating a configuration of a receiver for supporting a bit mapping method according to an embodiment of the present invention.

FIG. 10 is a block diagram illustrating a configuration of a receiver fpr supporting a bit mapping method according to an embodiment of the present invention.

As shown in FIG. 10, the receiver includes a demodulator 1010, a bit-constellation demapper 1030, a bit de-shifter 1050, an LDPC decoder 1070, and a controller 1090.

The demodulator 1010 performs demodulation on the received signal and outputs the demodulated signal to the bit-constellation demapper 1030. At this time, the demodulated signal is transferred to the controller 1090 either entirely or partially. The control unit 1090 detects the shift factor (S) used at the transmitter from the demodulated signal and determines a bit shift scheme to be applied at the receiver.

The bit-constellation demapper 1030 demaps the demodulated signal and outputs the LDPC codeword bits to the bit shifter 1050 under the control of the controller 1090. The bit shifter 1050 recovers the original arrangement of the bits of the LDPC codeword using Equations (1), (2), and (3) and outputs the LDPC codeword bits to the LDPC decoder 1070 under the control of the controller 1090. At this time, the bit shifting process is performed in the reverse order of the bit shifting process of the transmitter using Equation (1), (2), and (3). That is, the shift region of the low degree bits is shifted by a number of bits that is indicated by the shift factor in a direction reverse to the direction performed at the transmitter. The shift region is located at the position where the shift region is shifted thereto at the bit shifting process of the transmitter, and the low degree bits of the shift region are located at the bit positions where the low degree bits are shifted thereto at the bit shifting process of the transmitter.

The LDPC decoder 1070 performs LDPC decoding on the signal output by the bit shifter 1050 to output original data.

In the case where the transmitter and the receiver share the method on how to perform the bit shifting process, the bit shifting function of the controller 1090 can be simplified or removed.

Figure 11:
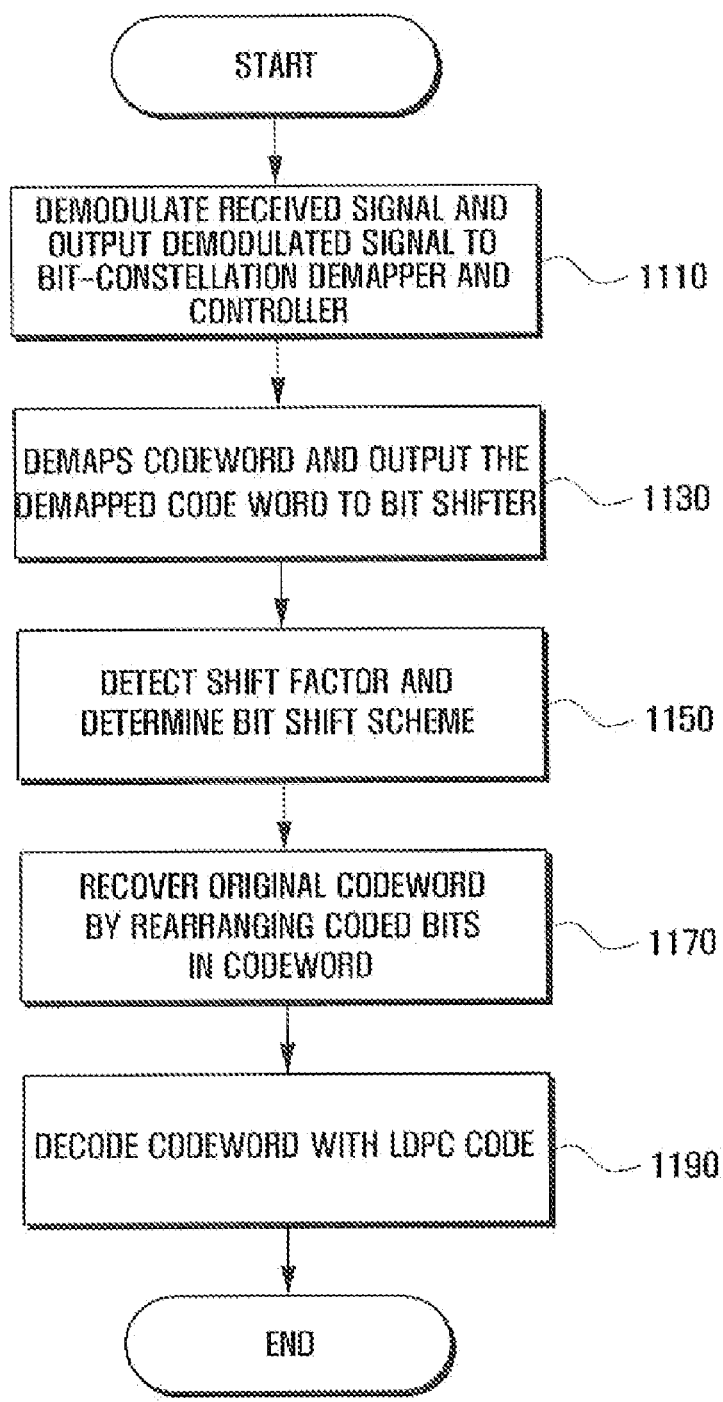
FIG. 11 is a flowchart illustrating a bit demapping method for a communication system using an LDPC code according to an embodiment of the present invention.

FIG. 11 is a flowchart illustrating a bit demapping method for a communication system using an LDPC code according to an exemplary embodiment of the present invention.

Referring to FIG. 11, once a signal is received, the demodulator 1010 of the receiver demodulates the received signal and outputs the demodulated signal to the bit-constellation demapper 1030 and the controller 1090 in step 1110. At this time, the controller 1090 can receive the information on only the shift factor (S) used in the transmitter. Next, the bit-constellation demapper performs demapping on the demodulated signal and outputs the codeword to the bit shifter 1050 in step 1130.

The control unit 1090 detects the shift factor (S) from the information provided by the demodulator 1010 and determines a bit shift scheme used at the transmitter in step 1150. Next, the bit shifter 1050 detects the shift region of the low degree bits of the LDPC codeword from the signal input by the bit-constellation demapper 1030 and shifts back the shift region by a number of bits that is indicated by the shift factor to its original position in step 1170. Accordingly, the rearranged bits of the LDPC codeword are recovered to their original positions in the LDPC codeword. That is, the bits of the LDPC codeword are arranged in order of the highest degree bits block, the intermediate degree bits block, and the low degree bits block and then input to the LDPC decoder 1070. Finally, the LDPC decoder decodes the shifted bit-recovered signal into the originally transmitted data in step 1190.

As described above, the bit mapping method and apparatus for a communication system using an LDPC code allows flexible interleaving and bit mapping depending on the degree distribution of the LDPC code and modulation scheme, thereby increasing the gain of LDPC codes. Also, the bit mapping method and apparatus of the present invention can improve the robustness to the wireless link environment in which the link performance is likely to be degraded due to noise, a fading effect, and ISI. Furthermore, the bit mapping method and apparatus of the present invention is capable of improving the Bit Error Rate (BER) performance in the wireless communication system, resulting in improvement of system throughput.

Although certain embodiments of the present invention have been described in detail hereinabove, it should be clearly understood that many variations and/or modifications of the basic inventive concepts herein taught which may appear to those skilled in the present art will still fall within the spirit and scope of the present invention, as defined in the appended claims.

What is claimed is:

1. A bit mapping method for a transmitter of a communication system, comprising the steps of:
   arranging, at a controller of the transmitter, a plurality of coded bits in a codeword in an order of recovery capability from a highest recovery capability to a lowest recovery capability;
   setting, at the controller, a shift region in the arranged plurality of coded bits that includes a number of coded bits having lowest recovery capabilities, wherein the number of coded bits is less than the plurality of coded bits;
   rearranging, at a bit shifter of the transmitter, the plurality of coded bits by shifting the number of coded bits in the shift region, in a direction toward a coded bit with the highest recovery capability within the plurality of coded bits, by a number of bits indicated by a shift factor; and
   mapping, at a bit mapper of the transmitter, the rearranged coded bits into a modulation symbol in an order of reliability from a lowest reliability bit position to a highest reliability bit position of the modulation symbol.

2. The bit mapping method of claim 1, wherein the codeword is generated by encoding input data bits with a Low Density Parity Check (LDPC) code, and the plurality of coded bits are arranged in an order of a degree of an LDPC coded bit.

3. The bit mapping method of claim 1, further comprising determining the shift factor depending on a recovery capability distribution of the plurality of coded bits in the codeword and a modulation scheme.

4. The bit mapping method of claim 1, wherein rearranging the coded bits further comprises:
   inserting remaining coded bits into bit positions left unoccupied by the number of coded bits in the shift region in the codeword while maintaining sequential order.

5. The bit mapping method of claim 2, wherein the shift region includes first and second degree coded bits of the LDPC code.

6. A bit demapping method for a receiver of a communication system, comprising the steps of:
   extracting, at a controller of the receiver, a shift factor from a signal demodulated from a received signal;
   demapping, at a bit demapper of the receiver, the demodulated signal to obtain a codeword of a plurality of coded bits; and
   rearranging, at a bit shifter of the receiver, the plurality of coded bits in the codeword by shifting a number of coded bits in a shift region, in a direction away from a coded bit with a highest recovery capability within the plurality of coded bits, by a number of bits indicated by the shift factor.

7. The bit demapping method of claim 6, wherein rearranging the plurality of coded bits further comprises:
   inserting remaining coded bits into bit positions left unoccupied by the number of coded bits in the shift region in the codeword while maintaining sequential order.

8. A bit mapping apparatus of a transmitter for a communication system, comprising:
   a controller for arranging a plurality of coded bits in a codeword in an order of recovery capability from a highest recovery capability to a lowest recovery capability, setting a shift region in the arranged plurality of coded bits that includes a number of coded bits having lowest recovery capabilities, and generating a shift factor, wherein the number of coded bits is less than the plurality of coded bits;
   a bit shifter for rearranging the plurality of coded bits by shifting the number of coded bits in the shift region, in a direction toward a coded bit with the highest recovery capability, by a number of bits indicated by the shift factor; and
   a bit mapper for mapping the rearranged coded bits into a modulation symbol in an order of reliability from a lowest reliability bit position to a highest reliability bit position of the modulation symbol.

9. The bit mapping apparatus of claim 8, wherein the codeword is generated by encoding input data bits with a Low Density Parity Check (LDPC) code, and the plurality of coded bits are arranged in an order of a degree of an LDPC coded bit.

10. The bit mapping apparatus of claim 8, wherein the controller determines the shift factor depending on a recovery capability distribution of the plurality of coded bits in the codeword and a modulation scheme.

11. The bit mapping apparatus of claim 8, wherein the bit shifter inserts remaining coded bits into bit positions left unoccupied by the number of coded bits in the shift region in the codeword while maintaining sequential order.

12. The bit mapping apparatus of claim 9, wherein the shift region includes first and second degree coded bits of the LDPC code.

13. A bit demapping apparatus of a receiver for a communication system, comprising:
   a demodulator for demodulating a received signal and outputting the demodulated signal;
   a controller for extracting a shift factor from the demodulated signal and determining a shift scheme based on the shift factor;
   a bit demapper for demapping the demodulated signal to obtain a codeword of a plurality of coded bits; and
   a bit shifter for rearranging the plurality of coded bits in the codeword by shifting a number of coded bits in a shift region, in a direction away from a coded bit with a highest recovery capability within the plurality of coded bits, by a number of bits indicated by the shift factor.

14. The bit demapping apparatus of claim 13, wherein the bit shifter inserts remaining coded bits into bit positions left unoccupied by the number of coded bits in the shift region in the codeword while maintaining sequential order.

* * * * *